United States Patent [19]

Tsuji et al.

[11] Patent Number: 6,160,380
[45] Date of Patent: Dec. 12, 2000

[54] METHOD AND APPARATUS OF CORRECTING BATTERY CHARACTERISTIC AND OF ESTIMATING RESIDUAL CAPACITY OF BATTERY

[75] Inventors: Tadashi Tsuji; Masato Origuchi, both of Kanagawa; Tsuyoshi Sodeno, Yokohama, all of Japan

[73] Assignee: Nissan Motor Co., Ltd., Kanagawa, Japan

[21] Appl. No.: 09/177,112

[22] Filed: Oct. 22, 1998

Related U.S. Application Data

[63] Continuation-in-part of application No. 09/022,497, Feb. 12, 1998, abandoned.

[30] Foreign Application Priority Data

Feb. 13, 1997 [JP] Japan .................................. 9-28979
Oct. 30, 1997 [JP] Japan ................................. 9-298959

[51] Int. Cl.[7] .................................................. H02J 7/00
[52] U.S. Cl. ......................... 320/132; 340/636; 324/427
[58] Field of Search ........................... 320/132; 324/427; 340/636

[56] References Cited

U.S. PATENT DOCUMENTS

| | | | |
|---|---|---|---|
| 5,539,318 | 7/1996 | Sasaki | 324/428 |
| 5,598,087 | 1/1997 | Hara | 324/431 |
| 5,612,608 | 3/1997 | Ishiguro et al. | 340/636 |
| 5,614,804 | 3/1997 | Kayano et al. | 320/134 |
| 5,650,712 | 7/1997 | Kawai et al. | 324/427 |

FOREIGN PATENT DOCUMENTS

| | | |
|---|---|---|
| 5-26987 | 2/1993 | Japan . |
| 5-66250 | 3/1993 | Japan . |
| 5-87896 | 4/1993 | Japan . |
| 5-134021 | 5/1993 | Japan . |

OTHER PUBLICATIONS

U.S.D.O.E., USABC Electric Vehicle Battery test Procedures Manual Revision 2, Jan. 1996.

*Primary Examiner*—Peter S. Wong
*Assistant Examiner*—Gregory J Toatley, Jr.
*Attorney, Agent, or Firm*—McDermott, Will & Emery

[57] ABSTRACT

A method and apparatus of estimating a residual energy of a battery for an electric vehicle. A battery characteristic is corrected on the basis of a temperature correction factor and a deterioration correction factor which are obtained on the basis of the condition of the battery. The deterioration correction factor includes an internal resistance deterioration correction factor indicative of a deterioration ratio of a battery internal resistance and a energy deterioration correction factor indicative of a deterioration ratio of a battery energy. The residual capacity is calculated on the basis of the corrected battery characteristic, a discharge current and a terminal voltage of the battery. Therefore, a residual energy meter accurately displays a residual energy of the battery.

31 Claims, 11 Drawing Sheets

METHOD AND APPARATUS OF CORRECTING BATTERY CHARACTERISTIC AND OF ESTIMATING RESIDUAL CAPACITY OF BATTERY

This application claims priority from and is a continuation-in-part application of U.S. patent application Ser. No. 09/022,497, filed Feb. 12, 1998, now abandoned which is incorporated herein by reference.

BACKGROUND OF THE INVENTION

The present invention relates to improvements in a method and apparatus for correcting a battery characteristic and for estimating a residual energy of a battery for an electric vehicle.

Generally, an electric vehicle is provided with a residual energy meter for informing a residual energy amount of a battery to a driver. Such a residual energy meter is normally required to have an appearance which is similar to that of a conventional fuel meter of an automotive vehicle equipped with an internal combustion engine. In case that such a conventional residual energy meter is arranged so as to obtain a residual energy (residual energy amount) of a battery by subtracting a discharged total power amount from a battery full capacity, a dischargeable amount from a full capacity (full charged) condition to a zero-power condition or a predetermined amount is used as a battery full capacity. For example, a relationship Wh(P) between a power P and a discharged power amount Wh, which is represented by a graph shown in FIG. 11, is employed to represent a residual energy of the battery. In this graph, the residual energy is a difference between a dischargeable power amount Wh(0) and a discharged amount IWh such that (residual capacity)= Wh(0)—IWh, wherein Iwh is an integrating amount of discharged power which is obtained by a predetermined calculating method using a current I and a voltage V of the battery. The dischargeable power amount Wh(0) employed in the above-mentioned equation is calculated on the basis of an initial characteristic of the battery put in the ordinary temperature.

However, since the dischargeable power amount Wh(0) is varied according to the change of the temperature and the deterioration of the battery, the residual energy which is calculated from the dischargeable power amount Wh(0) obtained on the basis of the initial battery characteristic, will generate a great different from an actual residual energy. This will cause a problem such that the residual energy meter cannot indicate an accurate residual energy. Further, since the discharged power amount at present time is obtained from the integrating amount of discharged power, the estimation accuracy of the residual energy is degraded according to the increase of the capacity of the battery due to the integration of various errors. Further, although the electric vehicle requires a minimum power Pmin for normally continuing the traveling thereof, the discharged power amount or discharged electric amount to zero is employed as a battery capacity. Therefore, the electric vehicle may suddenly stop traveling by a momentary voltage drop of the battery even if the residual energy meter indicates a value greater than zero.

SUMMARY OF THE INVENTION

It is an object of the present invention to provide a method and apparatus for correcting a battery characteristic and for estimating a residual energy of a battery, so as to accurately estimated the residual energy of a battery.

A first aspect of the present invention resides in a battery characteristic correcting method which comprises a step for detecting a temperature of a battery; a step for calculating temperature correction factors on the basis of the detected battery temperature; a step for detecting a discharge characteristic of the battery; a step for calculating a deterioration correction factor on the basis of the detected battery discharge characteristic; and a step for correcting a battery characteristic on the basis of the calculated battery temperature correction factor and the calculated deterioration correction factor.

Another aspect of the present invention resides in a battery residual energy estimating method which comprises a step for estimating a residual energy of the battery from the following equation, (residual energy)=(battery dischargeable power amount)−(battery discharged power amount)

wherein the dischargeable amount is a power amount which is discharged by the battery from a full capacity condition to a minimum power condition, and in the minimum power condition the battery can discharge a power for traveling an electric vehicle in a specified travel mode.

A further another aspect of the present invention resided in a residual energy estimating apparatus which comprises a battery characteristic calculating section which calculates the dischargeable amount and the discharged power amount of the battery from the corrected battery characteristic obtained by the battery characteristic correcting method as mentioned in the first aspect of the present invention; a residual energy calculating section which calculates the residual energy of the battery from the calculated dischargeable amount and the discharged power amount of the battery; and a display section which displays the residual energy calculated by the residual energy calculating section.

DETAILED DESCRIPTION OF THE INVENTION
(FIRST EMBODIMENT)

Referring to FIGS. 1 to 10, there is shown a first embodiment of a method and apparatus of correcting a battery characteristic and of estimating a residual energy of a battery for an electric vehicle, in accordance with the present invention.

First, the correcting method of the battery characteristic of the first embodiment according to the present invention will be discussed with reference to FIGS. 3A to 3C. The correction of the battery characteristic is executed by a temperature correction and a deterioration correction shown in FIGS. 3B and 3C.

Figure 3A:
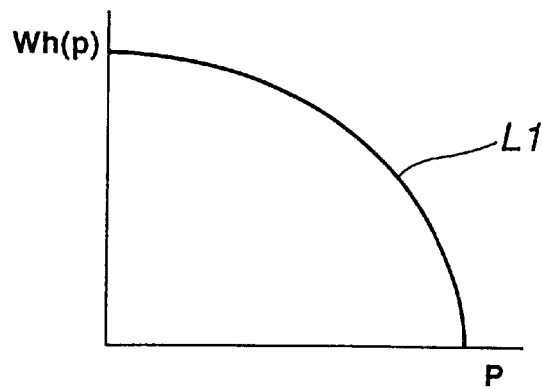
FIGS. 3A to 3C are graphs for explaining a temperature correction and a deterioration correction in a residual energy estimating method according to the present invention.
Figure 3B:
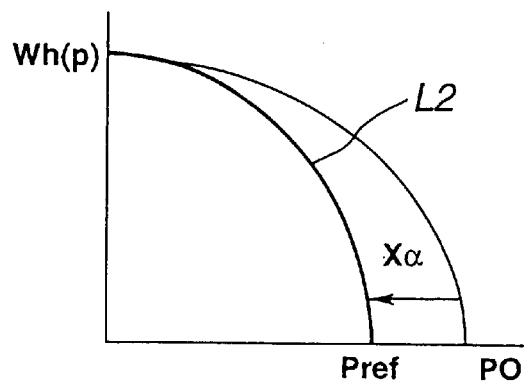
Figure 3C:
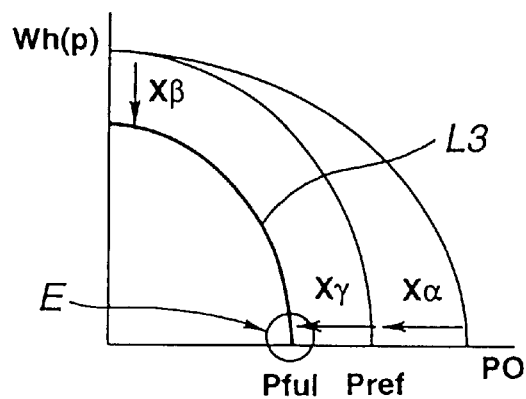

Each of FIGS. 3A to 3C discloses a relationship Wh(P) between each power characteristic and discharge power amount, that is, a battery characteristic. A line L1 of FIG. 3A shows a basic equation of Wh(P) which is obtained from an initial battery characteristic, wherein Wh(P) is normally approximated by n-order equation of a power calculation value P which value is able to be calculated during a vehicle traveling condition. In case of a lithium ion battery, a basic equation is approximated by the following equation (2). Since the measuring method and/or calculating method of a power calculation value P thereof is commonly known, the explanation thereof is omitted herein. The power calculation value P represents a dischargeable power of the battery which ensures a minimum value for operating the vehicle system.

$$Wh(P)=aP^3+bP^2+cP+d \qquad (2)$$

wherein a, b, c and d are factors which are determined from characteristics of an initial battery.

Next, the temperature correction as to the basic equation (2) is executed as shown in FIG. 3B. When it is defined that the temperature correction factor of the basic equation is α, the corrected equation is represented by the following equation (3).

$$Wh(P)=Wh(P/\alpha)$$
$$=a(P/\alpha)^3+b(P/\alpha)^2+c(P/\alpha)+d \qquad (3)$$

This corrected equation (3) forms a line L2 of FIG. 3B. As is clear from FIG. 3B, α is a proportional part with respect to the power, and the P intercept Pref of the temperature correction equation (3) is P0×α (Pref=P0×α). α is a parameter representative of a change of an internal resistance of the battery and is a table reference value. P0 is a P-axis intercept of the basic equation (2).

Further, by executing the deterioration correction as to the equation (3) corrected in temperature, the relational equation Wh(P), which includes the temperature correction and the deterioration correction, is represented as follows.

$$Wh(P)=Wh(P/\alpha)\times\beta$$
$$=a\beta(P/\alpha\beta)^3+b\beta(P/\alpha\beta)^2+c\beta(P/\alpha\beta)+d \qquad (4)$$

wherein γ is a parameter indicative of a change of an internal resistance of the battery, β is a parameter indicative of a change of electric capacity, and β=γ×η (η is a correction factor according to the temperature) although a relationship β=γ is basically established.

The equation (4) forms a line L3 of FIG. 3C and represents the battery characteristic corrected in temperature and deterioration. This method may be adopted to represent the relationship between the power characteristic and the discharge power amount if the relationship can be represented by using the above-mentioned parameter. This method can be used regardless the kind of the battery such as lead-acid and Ni—MH although it is necessary to study which factors (α, β, γ) are used in the temperature correction and the deterioration correction. Further, it will be understood that Wh(P) may not be approximated by the n-order equation of P. For example, if the relationship between P and Wh is stored in a table, Wh(P) is derived by the interpolation of the data in this table.

Next, the calculating method of the deterioration correction factor γ will be discussed. The deterioration correction factor γ is calculated by using the following equation (5) and is stored in a backup memory such as EEPROM every time when the power calculation value is obtained within full charge defining area of the battery. The full charge defining area is an area in which conditions for turning on a full charge lamp of the residual energy meter are satisfied. The full charge defining area is shown by a circle E in FIG. 3C.

$$\gamma=Pful/Pref=Pful/(P0\times\alpha) \qquad (5)$$

wherein Pful is an average value of the power calculation value obtained within the full charge defining area. In order to decrease the effect of the power calculation error, the average processing as to the n numbers of calculation values γ is executed. Further, the average value and the value of γ obtained by the previous correcting calculation are averaged and updated. That is, the average is obtained by the calculation {(previous value γ)+(average of the n numbers of the stored γ)}/2.

Figure 4:
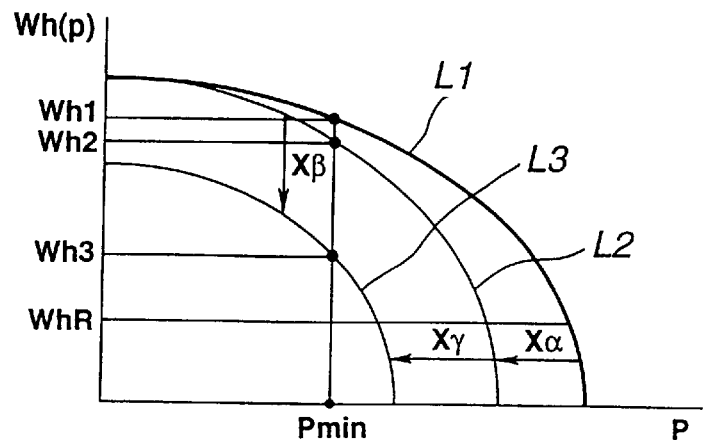
FIG. 4 is a graph for explaining the residual energy in an ordinary temperature of an initial condition, in a low temperature condition and in a lower temperature of a deteriorated condition.

By executing the temperature correction and the deterioration correction, it becomes possible to accurately estimate the residual energy put in the low temperature condition or deteriorated condition. FIG. 4 shows a battery characteristic in the normal-temperature initial condition, in low temperature condition, and in the low temperature and deteriorated condition, by lines L1, L2 and L3, respectively. In FIG. 4, WhR is an integrating amount of discharged power at present time, Pmin is a minimum output required for operating the electric vehicle and is a constant value regardless the temperature and deterioration of the battery.

Herein, it is defined that the battery capacity is the integrating amount of a dischargeable power at which the power becomes Pmin. The setting method of the battery capacity will be discussed later. When the discharge power amounts of the lines L1, L2 and L3 are defined as Wh1, Wh2 and Wh3, the residual energy under the ordinary-temperature and initial condition is Wh1−WhR, the residual energy under the low-temperature condition is Wh2−WhR, and the residual energy under the low-temperature deteriorated condition is Wh3−WhR.

Figure 5A:
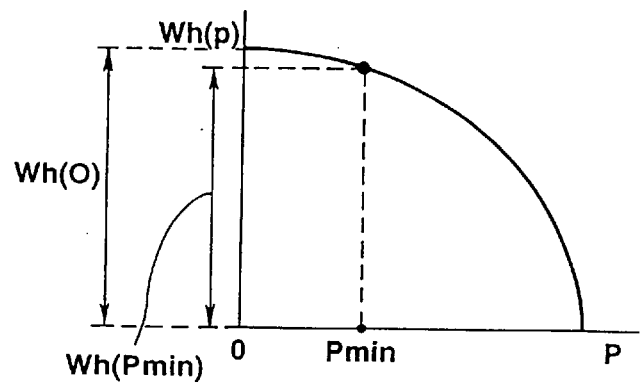
FIGS. 5A and 5B are graphs for explaining a method for setting the residual energy of the battery.
Figure 5B:
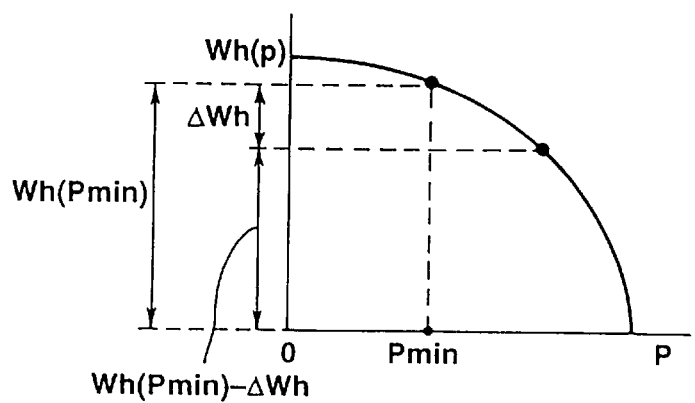

FIGS. 5A and 5B are explanatory views for explaining the setting method of the battery capacity. FIG. 5A shows a first setting method according to the present invention and FIG. 5B shows a second setting method according to the present invention. Conventionally, the dischargeable power amount Wh(0), which is defined as an amount of the dischargeable power amount from a present power amount to zero, is set as the battery capacity. But a power lower than the minimum ensured output Pmin is not available for the electric vehicle. That is, Wh(0)−Wh(Pmin) is the unavailable power amount, and it has been inconvenient to set the battery capacity at Wh(0).

Therefore, in the first setting method shown in FIG. 5A, the dischargeable power amount Wh(Pmin) that is the integrating amount of the dischargenable power until the power becomes Pmin, is set as a practical battery capacity. In the second setting method shown in FIG. 5B, ΔWh is a power amount by which the electric vehicle can travel x kilometers under a specified travel mode in that the maximum output is Pmin, and Wh(Pmin)−ΔWh is set as a practical battery capacity. By these settings of the practical battery capacity, even when the residual energy meter indicates EMPTY during the vehicle traveling condition, that is, even when the residual energy becomes zero, it is possible to further travel the electric vehicle by x kilometers under the specified travel mode. This prevents the vehicle from being put in a sudden stopping condition. The specified travel mode is generally similar to a mode under which the electric vehicle is traveling an urban area, such as 10-mode or SFUDS.

Figure 1:
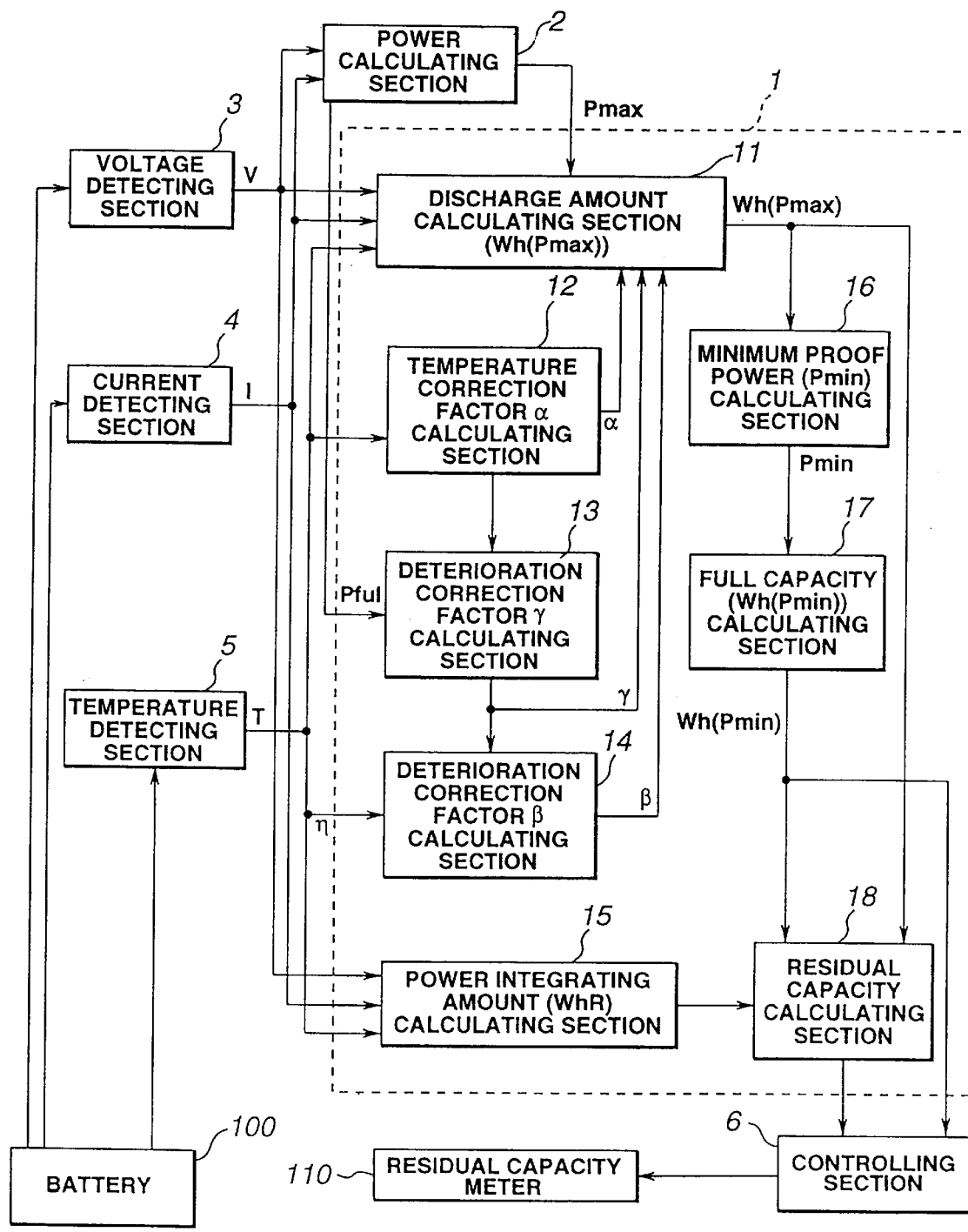
FIG. 1 is a block diagram of a residual energy estimating apparatus according to the present invention.
Figure 2:
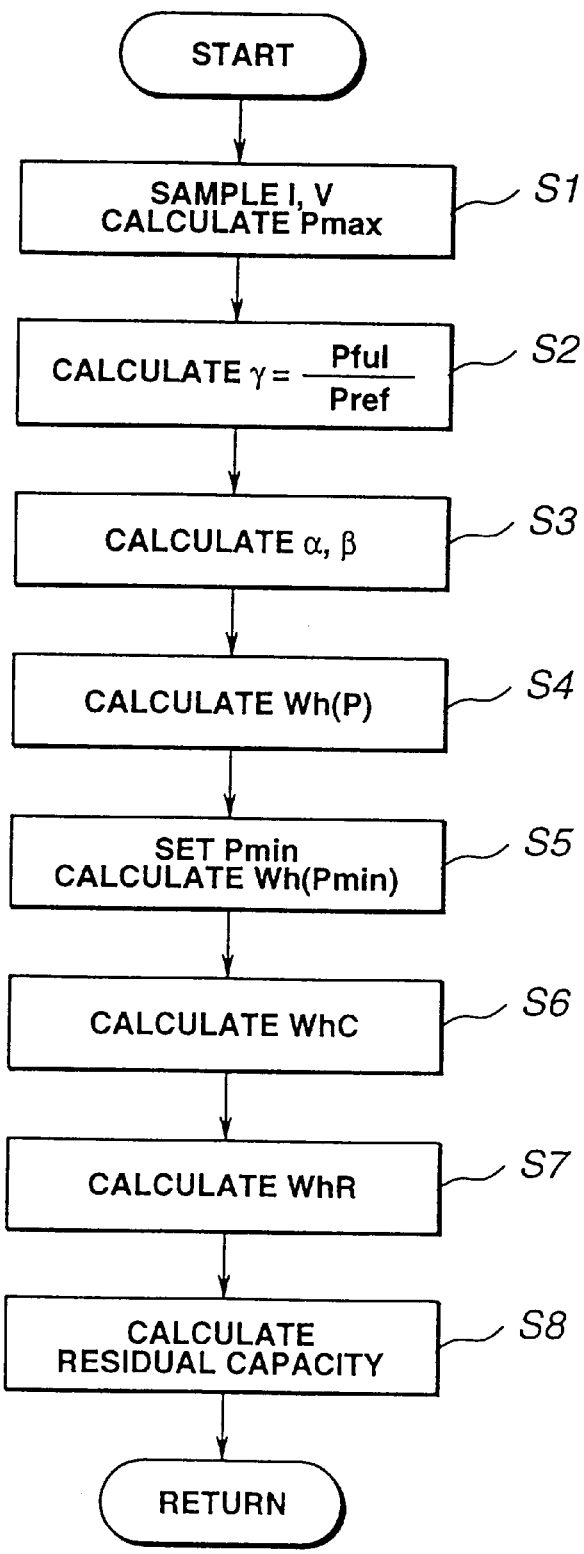
FIG. 2 is a flowchart showing a control of a residual energy meter of a first embodiment according to the present invention.

With reference to FIGS. 1 and 2, a control method of a residual energy meter 110 according to the present invention will be discussed. The control method, of course, includes the temperature correction and the deterioration correction.

As shown in FIG. 1, a residual energy calculating apparatus comprises a residual energy meter control calculating section 1, a power calculating section 2, a voltage detecting section 3, a current detecting section 4, a temperature detecting section 5, a controlling section 6 and a residual energy meter 110. The controlling section 6 executes an output limiting control of a battery 100 and a meter output control of the residual energy meter 110 on the basis of the calculated result of the residual energy meter control calculating section 1. The voltage detecting section 3, the current detecting section 4 and the temperature detecting section 5 are connected to the battery 100 so as to detect a voltage V, a current I and a temperature T of the battery 100, respectively. These detecting sections 3, 4 and 5 are connected to the residual energy meter control calculating section 1 so as to send signals indicative of the voltage V, the current I and the temperature T of the battery 100. Further, the voltage detecting section 3 and the current detecting section 4 are connected to the power calculating section 2 to send the signals indicative of the voltage V and the current I of the battery 100. The power calculating section 2 calculates a maximum output Pmax of the battery 100 on the basis of the voltage V and the current I, and sends the calculated maximum output Pmax to the residual energy meter control calculating section 1.

The residual energy meter control calculating section 1 comprises a discharge amount calculating section 11, a temperature correction factor α calculating section 12, a deterioration correction factor γ calculating section 13, a deterioration correction factor β calculating section 14, a power integrating amount calculating section 15, a minimum power Pmin calculating section 16, a full charge amount Wh(Pmin) calculating section 17, and a residual energy calculating section 18. The temperature correction factor α calculating section 12 calculates a temperature correction factor α on the basis of the signal indicative of the temperature T and sends the obtained temperature correction factor α to the discharge amount calculating section 11. The deterioration correction factor γ calculating section 13 calculates a deterioration correction factor γ on the basis of the signals from the power calculating section 2 and the temperature correction factor α calculating section 12. The deterioration correction factor β calculating section 14 calculates a deterioration correction factor β on the basis of the signals from the deterioration correction factor γ calculating section 13 and the temperature detecting section 5. The discharge amount calculating section 11 calculates the discharge amount Wh(Pmax) on the basis of the signals from the detecting sections 3, 4 and 5, the correction factor calculating sections 12, 13 and 14 and the power calculating section 2. The power integrating amount calculating section 15 calculates the power integrating amount WhR on the basis of the signals from the detecting sections 3, 4 and 5. The minimum power Pmin calculating section 16 calculates a minimum power Pmin on the basis of the signal indicative of the discharge amount Wh(Pmax) outputted from the minimum power calculating section 16. The full capacity calculating section 17 calculates a full charge amount Wh(Pmin) on the basis of the signal indicative of the minimum power Pmin outputted from the minimum power calculating section 16. The residual energy calculating section 18 calculates the residual energy of the battery 100 on the basis of the signals from the discharge amount calculating section 11, the power integrating amount calculating section 15 and the full capacity calculating section 17. The controlling section 6 controls the residual energy meter 110 and the battery 100 according to the signals from the residual energy calculating section 18 and the full capacity calculating section 17.

Next, the procedures of the residual energy estimating method executed by the residual energy meter control calculating section 1 according to the present invention will be discussed with reference to the flowchart of FIG. 2.

Figure 6:
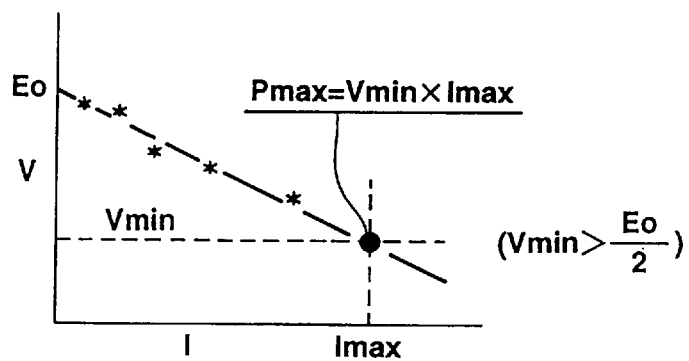
FIG. 6 is a graph for explaining a linear regression calculation which is used for obtaining Pmax.

At a step S1, the current I and the voltage V of the battery 100 are detected by the current detecting section 4 and the voltage detecting section 3, and the detected values are stored in the residual energy meter control calculating section 1. The power calculating section 2 calculates the first-order regression of the I–V characteristic by a specified discharge current as shown in FIG. 6.

Further, the power calculating section 2 calculates the maximum output Pmax of the battery 100 from the intersection between the I–V characteristic and the discharge minimum voltage Vmin which is a usable minimum voltage in the vehicle system. Herein, the maximum output Pmax is a dischargeable power (power calculation value) of the electric vehicle and is not the same as the maximum output P'max of the battery 100 put in the individual state. That is, the power P of the battery 100 is represented from the discharge current I and the discharge voltage V as follows.

$$P=IV$$
$$=V(E-V)/R$$
$$=-(V-EV)/R$$
$$=\{-V(V-E/2)^2/R\}+E^2/4R \qquad (6)$$

wherein E is an open voltage of the battery, and R is an internal resistance of the battery.

Therefore, the maximum output of the independent battery is univocally determined by the power P'max=$E^2$/4R in V=E/2. On the other hand, since the usable voltage range of the battery 100 of the electric vehicle is greater than or equal to V=E/2, the maximum output P'max of the battery is not employed. However, since the usable minimum voltage Vmin is determined from the following factors (a) and (b), the power at the minimum voltage Vmin becomes the maximun output Pmax=Imax×Vmin, wherein Imax is a current value at the voltage Vmin.

(a) a minimum voltage within the usable voltage range taking account of the life of the battery 100. (discharge ending voltage)

(b) a minimum voltage within the usable voltage range in which the performance and the function of the units of the electric vehicle are ensured.

At a step S2, the deterioration correction factor calculating section 13 calculates the deterioration correction factor $\gamma$ on the basis of the power Pfull in the full charged condition of the battery 100 and the temperature corrected power Pref, wherein the temperature corrected power Pref is calculated at the temperature correction factor calculating section 12 on the basis of the temperature T detected at the temperature detecting section 5. The power Pful in the full charged condition of the battery 100 is an average value of the power calculation value obtained within the full-charge defined range. The calculation of the deterioration correction factor $\gamma$ at the step S2 is executed only after the battery 100 is put in the full charged condition.

At a step S3, the temperature correction factor calculating section 12 calculates the temperature correction factor $\alpha$ on the basis of the temperature T of the battery 100, and the deterioration correction factor calculating section 14 calculates the deterioration correction factor $\beta$ on the basis of the temperature correction factor $\eta$ in the deteriorated condition and the calculated deterioration correction factor $\gamma$.

At a step S4, the discharge amount calculating section 11 executes the calculation of the battery characteristic equation Wh(P) representative of the relationship between the discharge power amount Wh and the power P according to the correction factors $\alpha$, $\beta$ and $\gamma$.

At a step S5, the minimum power calculating section 16 sets the minimum power Pmin, and the full capacity calculating section 17 calculates the battery capacity Wh(Pmin) representative of the capacity reaching Pmin.

At a step S6, the residual energy calculating section 18 calculates the capacity WhC at which an EMPTY lamp 110a of the residual energy meter 110 is turned on, by using the following equation (7).

$$WhC=Wh(Pmin)-\Delta Wh \quad (7)$$

wherein $\Delta$Wh is an ensured power amount after the turning-on of the EMPTY lamp 110a.

At a step S7, the discharge capacity calculating section 11 calculates the discharge power amount WHR=Wh(Pmax) at the present time from the calculated power calculation value Pmax and the battery characteristic equation Wh(P).

At a step S8, the residual energy calculating section 18 calculates the residual energy of the battery by using the following equation (8).

$$(\text{Residual capacity})=WhC-WhR \quad (8)$$

Figure 7:
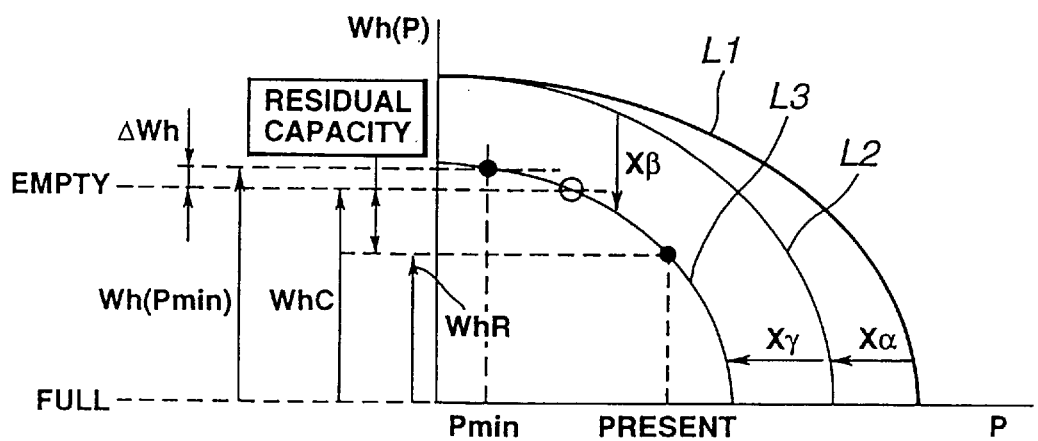
FIG. 7 is a graph showing a relationship between the power characteristic and a discharge power amount.

FIG. 7 shows a relationship between the power characteristic and the discharge power amount in view of the calculated amounts such as Whc in the flowchart of FIG. 2.

A full charge lamp 110b of the residual energy meter 110 is arranged such that when the condition that the normal charge control is normally finished is satisfied (this is defined as full charge) the discharge power is set at zero (WhR=0) and the full charge lamp 110b is turned on, and such that when WhR>(specified discharge power amount) the full charge lamp is turned off.

Figure 8:
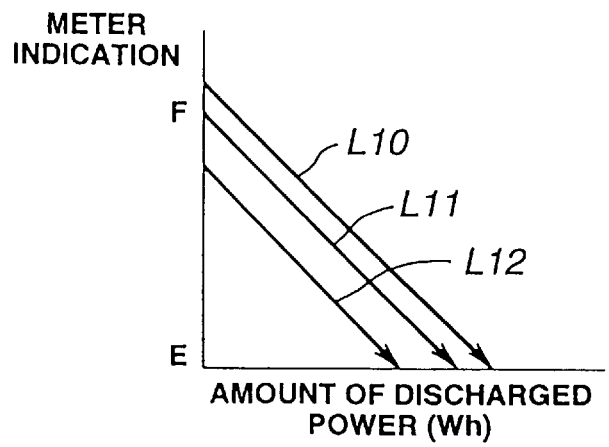
FIG. 8 is a graph showing a relationship between an indication of the residual energy meter and the discharge power amount.

As mentioned above, by executing the correction of the battery 100 according to the temperature and the deterioration of the battery 100, the relationship between the indication of the residual energy meter 110 and the discharge power amount is represented as shown in FIG. 8. That is, the battery 100 in an initial state performs a characteristic as shown by a straight line L10, the battery 100 in a low temperature condition performs a characteristic as shown by a straight line L11, and the battery 100 in the deteriorated condition performs a characteristic shown by a straight line L12. Since the lines L10, L11 and L12 are parallel with each other, the display of the residual energy meter 110 is linearly changed according to the travel distance of the electric vehicle in a specified travel mode, and one division of the residual energy meter 110 constantly indicates a constant distance.

Figure 9B:
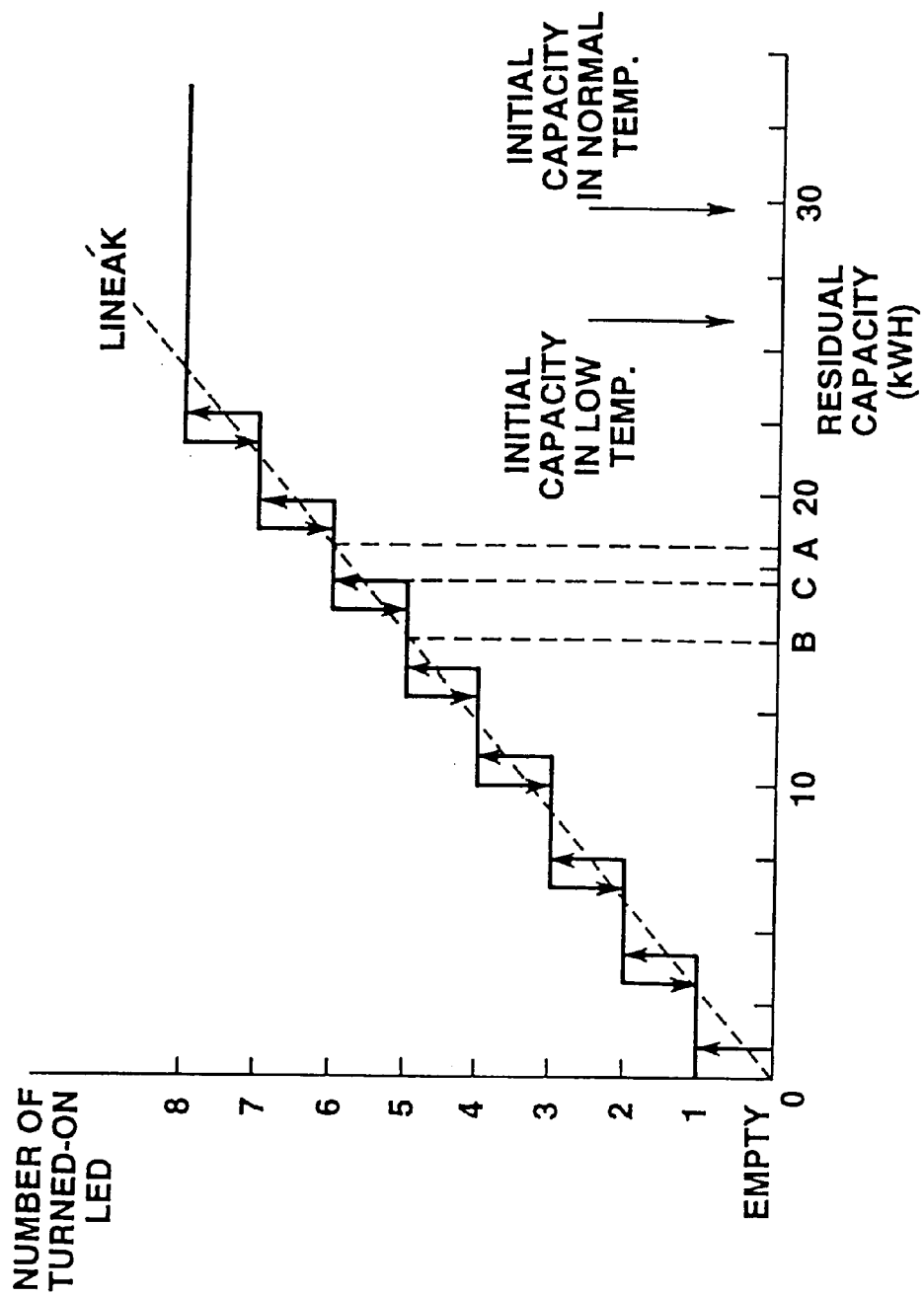
FIGS. 9A and 9B are graphs for explaining the indication and operation of the residual energy meter.
Figure 9A:
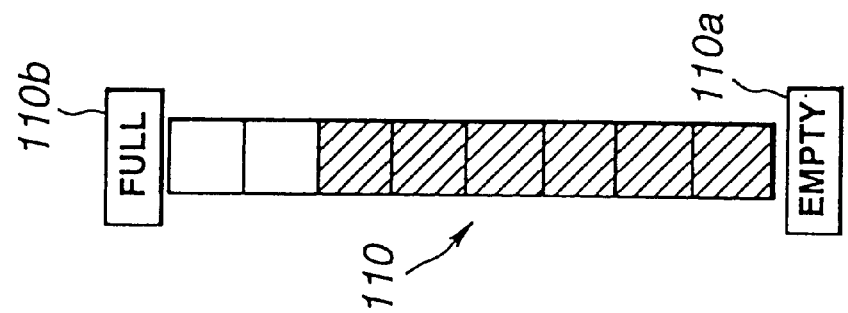

FIG. 9A shows a display of the residual energy meter 110. The displaying portion of the residual energy meter 110 is constituted by eight LED. The displaying portion is arranged such that a display of each LED is as same as the other display of the other one LED. In FIG. 9A, six LED are turned ON. In order to prevent the repeating of the turning on and off operations of LED caused by the deviation of the capacity calculation value and the capacity recovery due to regenerative control at a switching point, hysteresis of the turning on and off is set as shown in FIG. 9B. For example, when the residual energy changes from A to B in FIG. 9B, the number of the turned-on LED changes from six to five. However, the residual energy meter 110 is arranged so as not to change the number of the turned-on LED from five to six even if the residual energy is increased by the regenerative control and the like within the range to C in FIG. 9B. In FIG. 9B, the initial capacity of the lithium-ion battery put in a low temperature condition and the initial capacity of the lithium-ion battery put in a ordinary temperature are indicated, as reference.

Although the above-mentioned deterioration correction has been executed such that the parameter $\beta$ representative of the change of the capacity is obtained by the equation $\beta=\gamma\times\eta$ using the correction factor $\eta$, normally $\beta=\gamma$ is used upon assuming that $\beta$ has a correlation with $\gamma$ about one by one. However, since the deterioration tendency of $\beta$ is different from that of $\gamma$, the linearity of the residual energy meter 110 cannot be kept. Therefore, various researches have executed and a correlation between $\beta$ and $\gamma$ has been founded as shown in FIG. 10.

Figure 10:
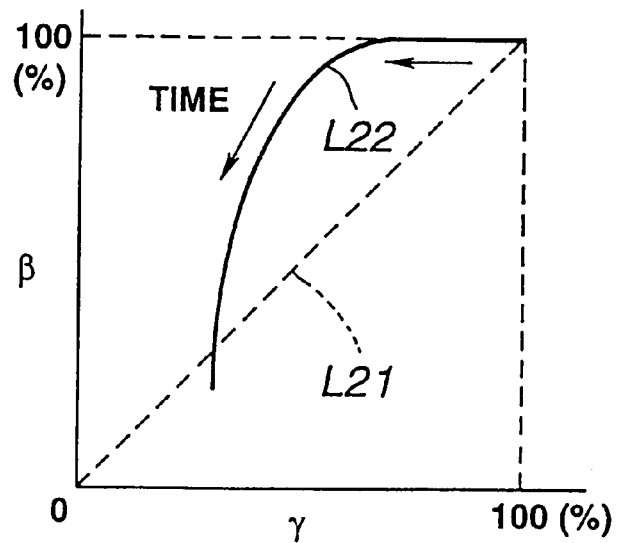
FIG. 10 is a graph showing a relationship between β and γ.
Figure 11:
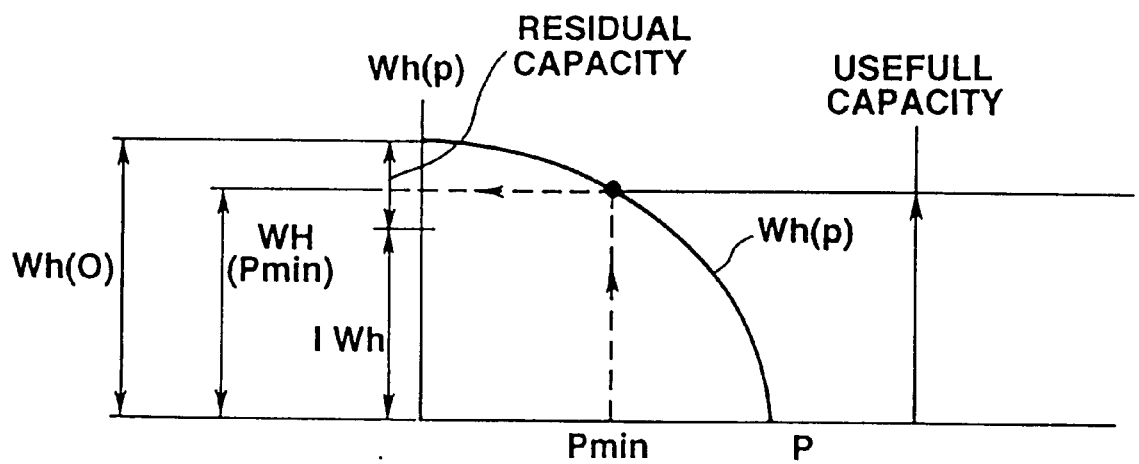
FIG. 11 is a graph for explaining the residual energy of a conventional type.

The correlation between $\beta$ and $\gamma$ shown in FIG. 10 was obtained from the relationship between the change of the capacity of the battery 100 and the output deterioration of the battery 100. In FIG. 10, a vertical axis represents $\beta$, and a horizontal axis represents $\gamma$. The units thereof are %. A dotted line L21 shows a correlation between $\beta$ and $\gamma$ in case that it is assumed that $\beta=\gamma$. A continuous line L22 shows a correlation between $\beta$ and $\gamma$ which correlation was obtained on the basis of the result of the experiments. The values of $\beta$ and $\gamma$ are changed on the continuous line L22 in the direction of arrows according to the elapse of time. As is clear from FIG. 10, at an initial condition of the battery, the battery performs $\beta=\gamma=100\%$, and $\gamma$ is decreased according to the elapse of time. However, $\beta$ is kept at 100% as long as $\gamma$ is put within a range from 100% to about 80%. Then, $\beta$ is decreased when $\gamma$ becomes smaller than about 80%. From the correlation shown in FIG. 10, a correlation factor δ (=β/γ) is obtained, so that β is calculated from the equation β=δ·γ. By the employment of this correlation, the linearity of the residual energy meter 110 is ensured.

The deterioration correction factor γ corresponds to a correction factor of the change of the internal resistance of the battery. The deterioration correction factor β corresponds to a correction factor of the change of the capacity of the battery. The correlation factor δ corresponds to the correlation between the internal resistance change correction factor and the capacity change correction factor. The relationship Wh(P) corresponds to a correlation relationship between the discharge power amount and the power.

Although the first embodiment according to the present invention has been shown and described such that the integrating amount of the discharged power WhR at present time is calculated from the calculated power calculation value Pmax and the characteristic equation Wh(P) shown in the step S7 shown in FIG. 2, the integrating amount of the discharged amount WhR may be calculated by employing the following equation.

$$WhR = \int IVdt - (\int Idt \times Vec \times \phi) \qquad (9)$$

wherein the integral of the first term is an integrating amount of the discharged power amount, the integral of the second term is an integrating amount of the charged current amount, Vec is a voltage for transforming it into the discharged power amount and is a constant corresponding to the depth of the discharge, and φ is a charging efficiency and is a constant corresponding to the current. In case that the battery is put in the full charged condition, the residual energy meter is reset at WhR=0. In case that the residual energy becomes zero, the residual energy meter is reset at WhR=Wh(Pmin). With these reset operations, the stacking of the integrating power errors during the charging period is prevented.

(SECOND EMBODIMENT)

Referring to FIGS. 12 to 14B, there is shown a second embodiment of the method and apparatus of correcting the battery characteristic and of estimating the residual energy of the battery for the electric vehicle in accordance with the present invention. The second embodiment is the same as the first embodiment except for the calculation method of the correction factors β and γ. Since the correction method of the battery characteristic and the construction of the residual energy calculating apparatus in the second embodiment are the same as those of the first embodiment, the explanation of the same parts thereof will be omitted herein.

The calculation method of the correction factors β and γ of the second embodiment will be discussed.

Figure 13A:
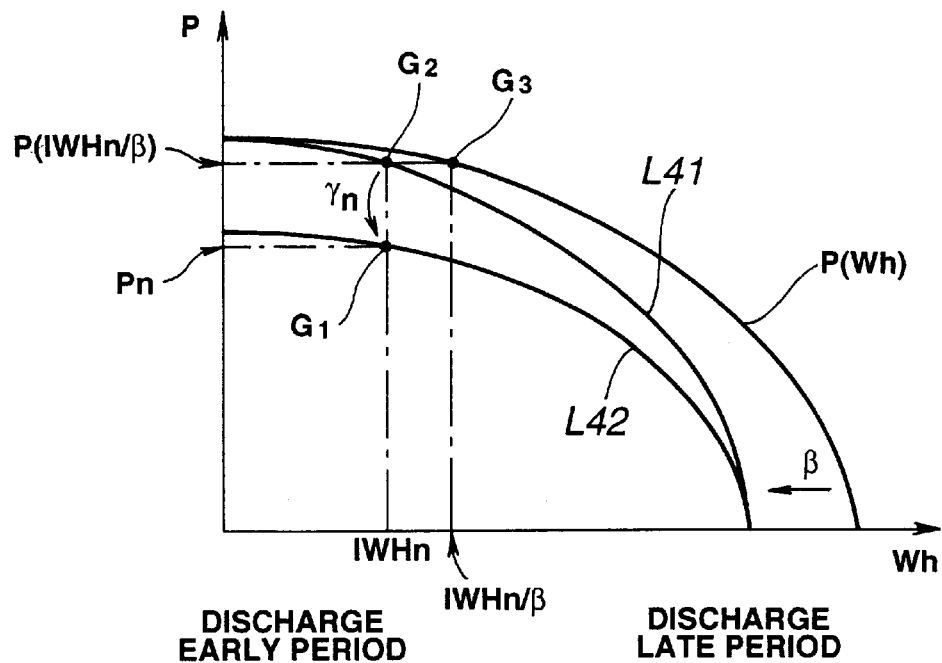
FIGS. 13A and 13B are graphs for explaining a calculation method of an internal resistance deterioration correction factor γ of the second embodiment according to the present invention.
Figure 13B:
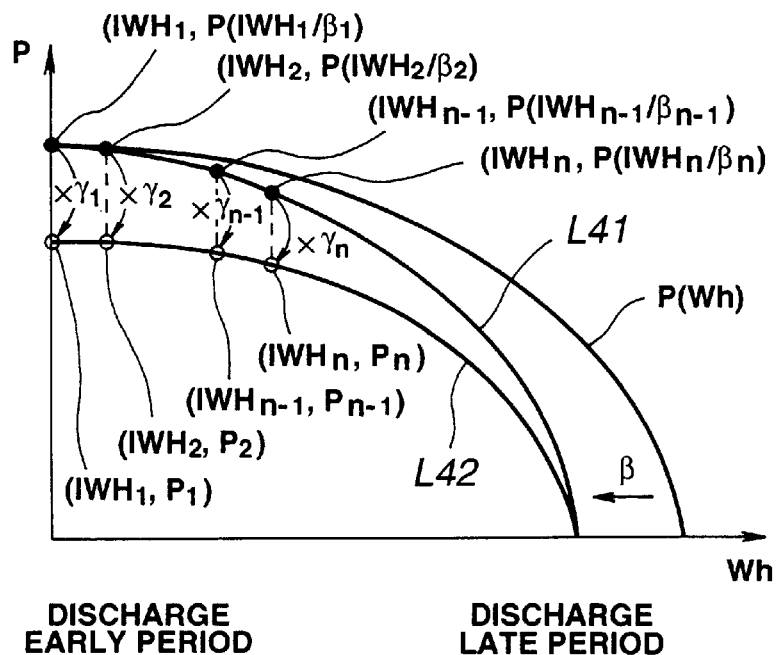

First, the calculation method of the correction factor γ of the second embodiment will be discussed with reference to FIGS. 13A and 13B. A graph of FIG. 13A shows a relationship between the discharged power amount Wh and the dischargeable power P of the battery. A line P(Wh) represents an initial characteristic of the battery. A line L41 is a characteristic curve which is obtained by correcting the initial characteristic curve P(Wh) by means of the capacity deterioration correction factor β. A line L42 represents an actual battery characteristic. Herein, it is assumed that the factor β employed in this calculation is that in a non-full capacity (charged) condition of the battery and that during a vehicle running condition the power calculation is executed to obtain a discharge power integrating amount IWHn and to use it as the power calculation value Pn. From these assumptions, a point G1(IWHn, Pn) is determined on the line L42. A point G2 on the line L41 has a Wh-coordinate IWHn as same as that of the point G1. A point G3 on the line P(Wh) has a P-coordinate as same as that of the point G2. The Wh-coodinate of the point G3 is represented by IWHn/β and the P-coordinate of the point G3 is represented by P(IWHn/β). Therefore, the line L42 is obtained by correcting the line L41 by means of the correction factor γn calculated from the following equation (10).

$$\gamma n = Pn/P(IWHn/\beta) \qquad (10)$$

As is clear from FIG. 13A, since the difference between the P-coordinates of the points G1 and G2 is gradually decreased according to the increase of a DOD (depth of discharge) of the battery, the error of the correction factor γn is largely effected by the errors of the discharged power amount value IWHn and the power calculation value Pn in the discharge late period. Therefore, the calculation of the correction factor γn is executed during an early period such as a period where the DOD ranges from 0% to 50%. For example, in a full capacity range a factor γ1 is calculated, and factors γ2 to γn are calculated at proper timings within the range of DOD 0% to 50%, as shown in FIG. 13B. Then, an average γ thereof is obtained by the following equation (11).

$$\gamma = (\gamma 1 + \gamma 2 + \ldots + \gamma n)/n \qquad (11)$$

The obtained average γ is used as an internal resistance deterioration correction factor representative of a change of the internal resistance.

Figure 14A:
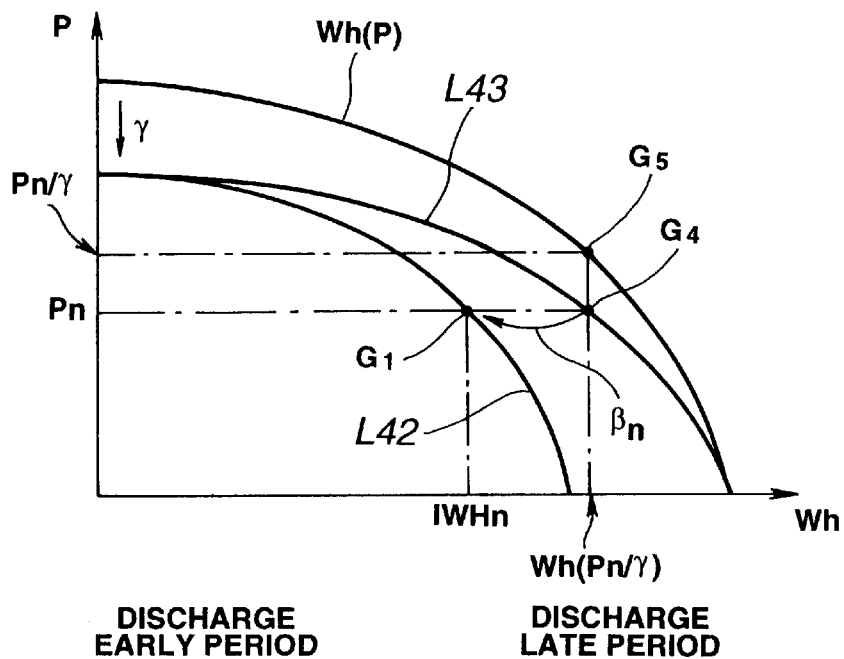
FIGS. 14A and 14B are graphs for explaining a calculation method of a capacity deterioration correction factor β of the second embodiment.
Figure 14B:
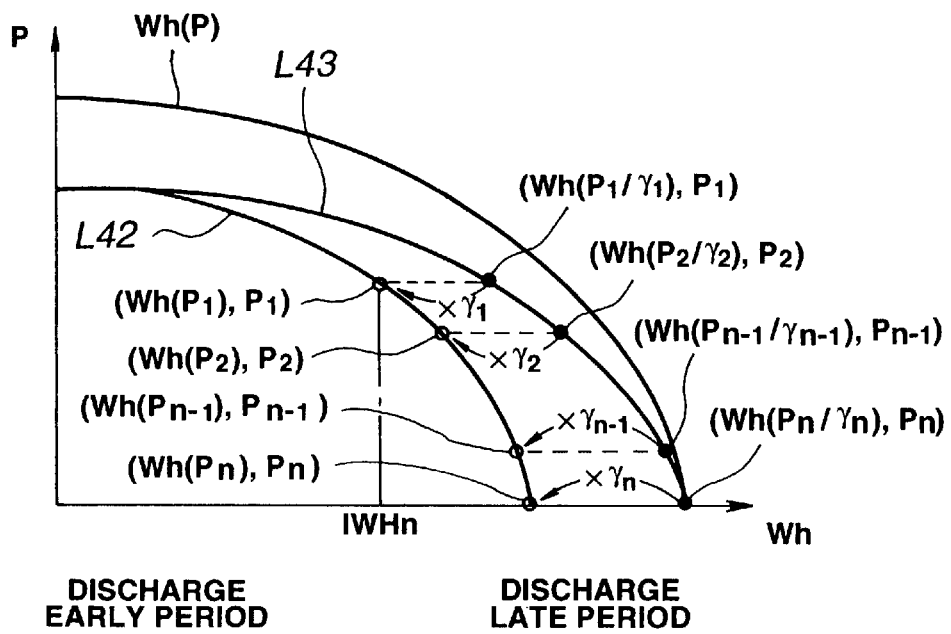

Next, the calculation method of the correction factor β of the second embodiment will be discussed with reference to FIGS. 14A and 14B. A graph of FIG. 14A shows a relationship between the discharged power amount and the dischargeable power of the battery. A line P(Wh) is the characteristic curve indicative of the initial characteristic of the battery. A curved line L43 is a characteristic curve which is obtained by correcting the initial characteristic curve P(Wh) by means of the internal resistance deterioration correction factor γ. The line L42 represents the actual battery characteristic. Herein, it is assumed that the power Pn is ensured when the discharged power amount value takes IWHn. From this assumption, a point G1(IWHn, Pn) is determined on the line L42. A point G4 on the line L43 has a Wh-coordinate IWHn as same as that of the point G1. A point G5 on the line P(Wh) has a P-coordinate as same as that of the point G4. The P-coodinate of the point G5 is represented by Pn/γ and the Wh-coordinate of the point G5 is represented by P(IWHn/γ). Therefore, the line L42 is obtained by correcting the line L43 by means of the correction factor βn calculated from the following equation (12).

$$\beta n = IWHn/Wh(Pn/\gamma) \qquad (12)$$

In case of the capacity deterioration correction factor β, since the difference between the Wh-coordinates of the points G1 and G4 is small during the discharge early period, the error of the correction factor βn is largely effected by the errors of the discharged power amount value IWHn and the power calculation value Pn in the discharge early period. Therefore, the calculation of the correction factor βn is executed during the discharge late period such as a period where the DOD ranges from 50% to 100%. For example, factors β1 to βn are calculated at proper timings within the range of DOD 50% to 100%, as showin in FIG. 14B. Then, an average β thereof is obtained by the following equation (13).

$$\beta = (\beta 1 + \beta 2 + \ldots + \beta n)/n \qquad (13)$$

The obtained average β is used as the capacity deterioration correction factor representative of a change of the battery capacity.

During the vehicle running condition and after the next full charge of the battery, the correction factor $\gamma$ during the discharge early period is calculated from the obtained factor $\beta$. Although the above-mentioned example is arranged such that each of the correction factors $\gamma$ and $\beta$ is obtained by averaging the values detected n-times, it is of course that each of the correction factors $\gamma$ and $\beta$ may be obtained by averaging a newest calculated value and a value before the newest value of the n-times detected values as follows.

$$\gamma = (\gamma n-1+\gamma n)/2 \quad (14)$$

$$\beta = (\beta n-1+\beta n)2 \quad (15)$$

Therefore, the final battery characteristic Wh(P)', which has been already corrected with respect to the change of the internal resistance and the change of the battery capacity, is derived from the obtained correction factors $\gamma$ and $\beta$ and the initial battery characteristic Wh(P) as follows.

$$Wh(P)' = Wh(P/\gamma) \times \beta \quad (16)$$

The residual energy is calculated from the discharged power amount IWH and the estimated battery capacity based on the obtained characteristic Wh(P)' as follows.

(residual energy)=(estimated battery capacity)−(discharged power integrated amount)

$$= \{Wh(Pmin)'-\Delta Wh\}-IWH \quad (17)$$

wherein Pmin and $\Delta$Wh are the same as those used in the equation (7).

Next, the residual capacity estimating method of the second embodiment will be discussed with reference to a flowchart of FIG. 12.

At a step S101, as is similar to the step SI of the first embodiment, the current I and the voltage V of the battery 100 are detected (sampled) by the current detecting section 4 and the voltage detecting section 3, and the detected values are stored in the residual energy meter control calculating section 1. Further, the power calculating section 2 calculates the first-order regression of the I–V characteristic by a specified discharge current as shown in FIG. 6. Further, the power calculating section 2 calculates the maximum output Pmax of the battery 100 from the intersection between the I–V characteristic and the discharge minimum voltage Vmin which is a usable minimum voltage in the vehicle system. Herein, the maximum output Pmax is a dischargeable power (power calculation value) of the electric vehicle and is not the same as the maximum output P'max of the battery 100 put in the individual state.

At a step S102, the correction factors $\alpha$, $\beta$ and $\gamma$ are calculated. More particularly, the temperature correction factor $\alpha$ is calculated by the temperature correction factor calculating section 12 on the basis of the temperature T. The internal resistance deterioration correction factor $\gamma$ is calculated by averaging the obtained correction factors $\gamma$n as mentioned above, upon employing the above-mentioned equation (11) or (14). The capacity deterioration correction factor $\beta$ is calculated by averaging the obtained correction factors $\beta$n as mentioned above, upon employing the above-mentioned equation (13) or (15).

At a step S103, as is similar to the step S4 of the first embodiment, the discharge amount calculating section 11 executes the calculation of the battery characteristic equation Wh(P) representative of the relationship between the discharge power amount Wh and the power $\beta$ according to the correction factors $\alpha$, $\beta$ and $\gamma$.

At a step S104, as is the same as the step S5 of the first embodiment, the minimum power calculating section 16 sets the minimum power Pmin, and the full capacity calculating section 17 calculates the battery capacity Wh(Pmin) representative of the capacity reaching Pmin.

At a step S105, as is the same as the step S6 of the first embodimet, the residual energy calculating section 18 calculates the capacity WhC at which an EMPTY lamp 110a of the residual capacity meter 110 is turned on, by using the following equation (7).

$$WhC = Wh(Pmin) - \Delta Wh \quad (7)$$

wherein $\Delta$Wh is an ensured power amount after the turning-on of the EMPTY lamp 110a.

At a step S106, as is the same as the step S7 off the first embodiemnt, the discharge capacity calculating section 11 calculates the discharge power amount WHR=Wh(Pmax) at the present time from the calculated power calculation value Pmax and the battery characteristic equation Wh(P).

At a step S107, as is the same as the step S8 of the first embodiment, the residual energy calculating section 18 calculates the residual energy of the battery by using the following equation (8).

$$(\text{Residual energy}) = WhC - WhR \quad (8)$$

Then, the routine returns to the start step.

(THIRD EMBODIMENT)

A third embodiment of the method and apparatus according to the present invention is also the same as the first embodiment except for the calculation method of the correction factor $\gamma$. Since the correction method of the battery characteristic and the construction of the residual energy calculating apparatus in the third embodiment are the same as those of the first embodiment, the explanation of the same parts thereof will be omitted herein.

The calculation method of the correction factors $\beta$ and $\gamma$ of the third embodiment will be discussed.

The calculation method of the correction factor $\gamma$ of the third embodiment is the same as that of the second embodiment. That is, the internal resistance deterioration correction factor $\gamma$ of the third embodiment is obtained from the equation (11) or (14) obtained by the calculation method mentioned in the second embodiment.

$$\gamma' = (\gamma 1+\gamma 2+\ldots+\gamma n)/n \quad (11)$$

$$\gamma' = (\gamma n-1+\gamma n)/2 \quad (14)$$

On the other hand, the capacity deterioration correction factor $\beta$ of the third embodiment is obtained from the correlation between $\beta$ and $\gamma$ which correlation is explained in the first embodiment. The correlation shown in FIG. 10 was obtained by the experiments of the inventors of the present invention.

Figure 12:
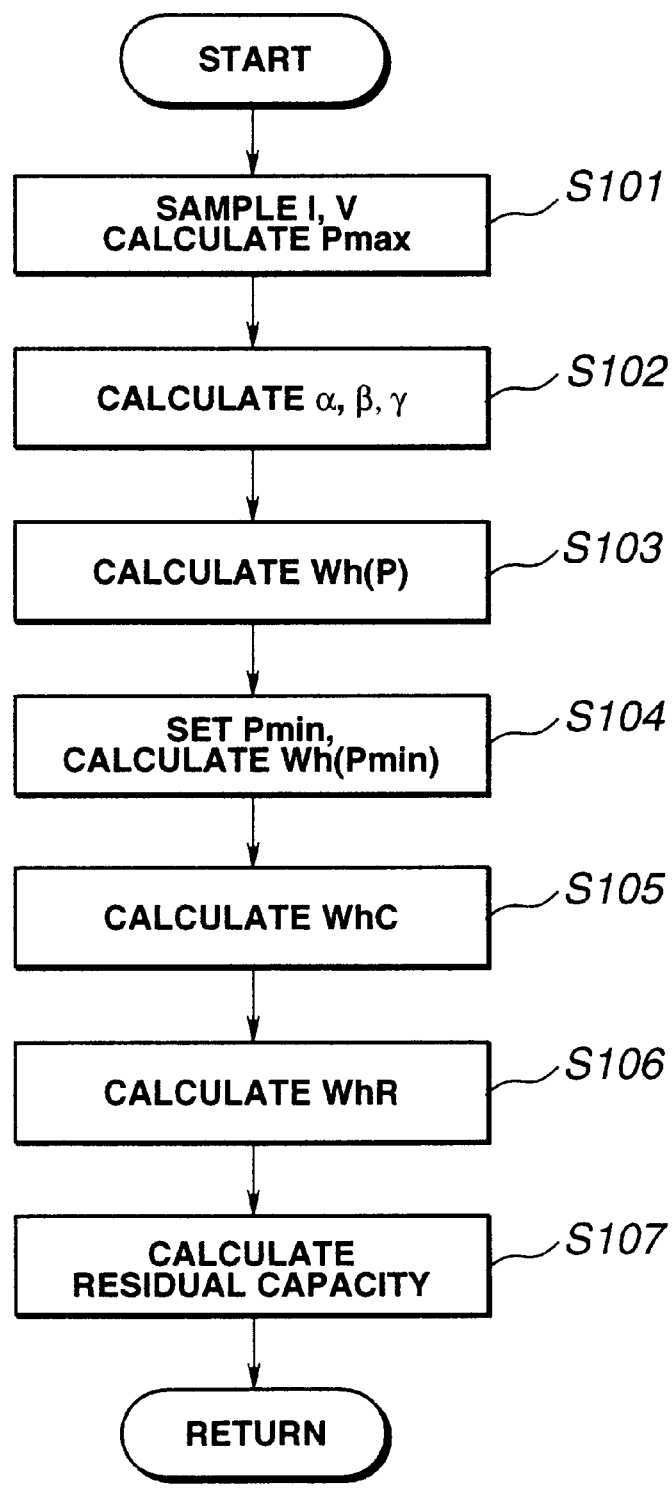
FIG. 12 is a flowchart showing a control of a residual energy meter of a second embodiment according to the present invention.

Therefore, the procedure of the residual energy estimating method of the third embodiment are basically the same as those of the second embodiment shown by the flowchart of FIG. 12. Only the execution of the step S102 of the third embodiment is different from that of the second embodiment. That is, in the procedure of the residual energy estimating method of the third embodiment, at the step S102, the correction factors $\alpha$, $\beta$ and $\gamma$ are calculated. More particularly, the temperature correction factor $\alpha$ is calculated by the temperature correction factor calculating section 12 on the basis of the temperature T. The internal resistance deterioration correction factor $\gamma$ is calculated by averaging the obtained correction factors $\gamma$n as mentioned above, upon employing the above-mentioned equation (11) or (14). The capacity deterioration correction factor β is calculated from the β–γ correlation which is shown in FIG. 10 and is explained in the first embodiment.

(FOURTH EMBODIMENT)

Figure 15:
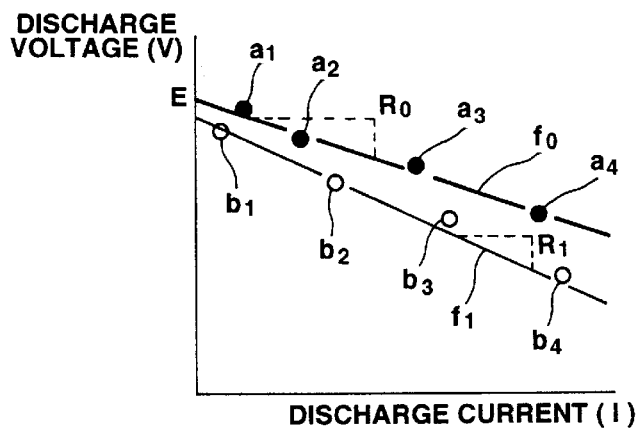
FIG. 15 is a graph for explaining a calculation method of the internal resistance deterioration correction factor γ of a fourth embodiment according to the present invention.
Figure 16:
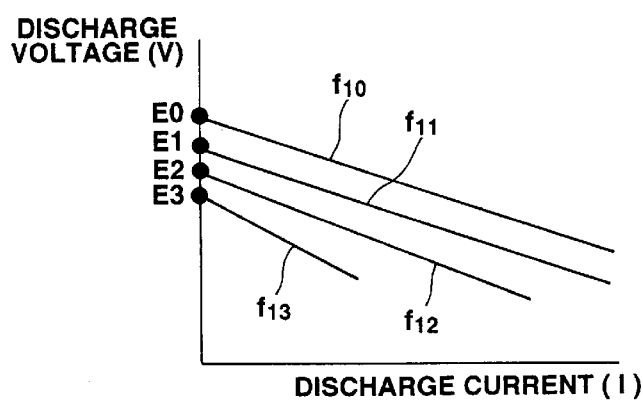
FIG. 16 is a graph for explaining a calculation method of the capacity deterioration correction factor β of the fourth embodiment.
Figure 17:
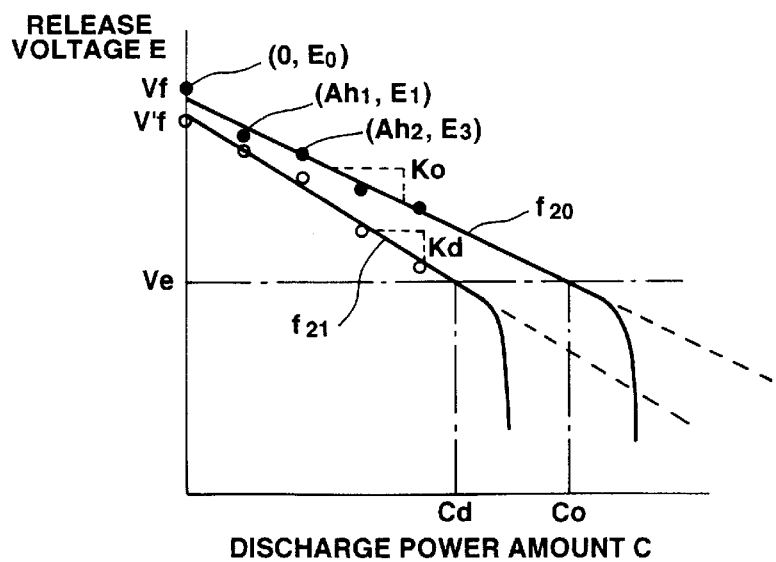
FIG. 17 is another graph for explaining a calculation method of the capacity deterioration correction factor β of the fourth embodiment.

Referring to FIGS. 15 to 17, there is shown a fourth embodiment of the method and apparatus of correcting the battery characteristic and of estimating the residual energy of the battery for the electric vehicle in accordance with the present invention. The fourth embodiment is the same as the first embodiment except for the calculation method of the correction factors β and γ. Since the correction method of the battery characteristic and the construction of the residual energy calculating apparatus in the fourth embodiment are the same as those of the first embodiment, the explanation thereof will be omitted herein.

First, the calculation method of the internal resistance deterioration correction factor γ will be discussed with reference to FIG. 15. Points a1 to a4 and b1 to b4 in a graph of FIG. 15 were obtained by repeatedly measuring the relationship between the discharge current I and the discharge voltage V of the battery during discharge. The points a1 to a4 represent measured data of a new battery. The points b1 to b4 represent measured data of a deteriorated battery due to a long-time use. Lines f0 and f1 represent discharge I–V characteristics obtained by the linear regression of the obtained data. The gradient of each line f0, f1 represents an internal resistance R of the battery. An intercept of the I–V characteristic line with respect to an E-axis of the discharge voltage V represents an estimated open-circuit voltage E. That is, the I–V characteristic line is represented by the following equation (18).

$$V = E - IR \tag{18}$$

Accordingly, the characteristic line f0 derives an internal resistance R0 of a new battery. The characteristic line f1 derives an internal resistance R1 of a deteriorated battery. Therefore, the internal resistance deterioration correction factor γ is calculated from the following equation (19).

$$\gamma = R0/R1 \tag{19}$$

The calculations of the internal resistance Rn are executed plural times (n-times) at predetermined discharged power amount intervals within the discharge early period (DOD ranges from 0 to 50%), and the average of the plural calculation results (R1, - - - , Rn) is obtained. Further, the internal resistance deterioration correction factor γ is calculated from the average of the internal resistance calculation values of the initial battery and that of the deteriorated battery. That is, when the internal resistances of the new battery measured at plural times are R01, R02, , R0m and when the internal resistances of the deteriorated battery measured at plural times are Rd1, Rd2, . . . , Rdn, the internal resistance deterioration correction factor γ is calculated by the following equations (20).

$$R0 = (R01 + R02 + \ldots + R0m)/m$$

$$Rd = (Rd1 + Rd2 + \ldots + Rdn)/n$$

$$\gamma = R0/Rd \tag{20}$$

Next, the calculation method of the capacity deterioration correction factor β of the fourth embodiment will be discussed hereinafter. FIG. 16 shows discharge I–V characteristic lines under various DOD (depth of discharge). A line f10 is a discharge I–V characteristic line under a condition that Ah=0, that is, DOD=0%. According to the increase of the discharged power integrating amount Ah such as 0→Ah1→Ah2→Ah3 of FIG. 16, the characteristic line changes such that f10→f11→f12→f13 of FIG. 16. Simultaneously, the estimated open-circuit voltage changes such as E0→E1→E2→E3 of FIG. 16. An actual open-circuit voltage measured under a no-load condition may be employed as the open-circuit voltage. Lithium-ion battery or Nickel-Hydrogen battery performs a high linear characteristic of the discharge I–V characteristic and operates such that an estimated open-circuit voltage thereof highly corresponds to the actual open-circuit voltage thereof. In case of lithium-ion battery, the gradient of the characteristic line is kept generally constant within a range where the DOD ranges from 0% to 50%. Therefore, the change of the open-circuit voltage generally represents the change of the battery capacity.

With respect to various open-circuit electric quantities such as at predetermined discharged electric amount, estimated open-circuit voltages E0 to Ej were obtained. Then, the relationship between the discharged electric amount C(Ah) and the open-circuit voltage E(V) was calculated by employing the linear regression or plural-order regression. FIG. 17 shows regression lines with respect to Lithium-ion battery. The battery characteristic obtained by the linear regression of Lithium-ion battery finely corresponded to an actual battery characteristic thereof. A line f20 represents an initial characteristic of a new battery, and a line f21 presents an actual (deteriorated) characteristic of the battery (deteriorated). By the linear regression, these lines f20 and f21 are represented by the following equation (21).

$$E = Vf - C \cdot K \tag{21}$$

wherein K is a gradient of the characteristic line, Vf is a voltage intercept of the characteristic line.

When the battery is put in a discharged condition (within a range from discharge intermediate period to a discharge late period) enough to obtain the regression line, the battery capacity C0, Cd is derived from the discharged power amount at an intersection between the regression line and the predetermined discharge capacity reference voltage Ve obtained by the interpolation of the regression equation. Each of the battery capacity C0 and Cd is represented by the following equation (22).

$$C0 = (Vf - Ve)/K0$$

$$Cd = (Vf - Ve)/Kd \tag{22}$$

The capacity deterioration correction factor β is obtained from the following equation (23).

$$\beta = Cd/C0 \tag{23}$$

In this fourth embodiment, since the correction factors β and γ are obtained by directly obtained the change of the internal resistance and the change of the battery capacity, the following merits are obtained.

(a) By separating the internal resistance deterioration amount and the discharge capacity deterioration amount, the correction factors β and γ are directly obtained from the ratio of the internal resistances between the new battery and the deteriorated battery and the ratio of the capacity between the new battery and the deteriorated battery, respectively.

(b) By obtaining the regression curve shown in FIG. 17, the change of the open-circuit voltage is obtained, and the discharge capacity is estimated. Therefore, it is possible to obtain the high-accuracy correction factor.

In particular, when the correlation between the discharge power amount and the open-circuit voltage is established as shown in FIG. 13, such as in case of a Lithium-ion battery, this correction factor calculation method of the fifth embodiment accurately functions.

Therefore, the procedure of the residual capacity estimating method of the fourth embodiment are basically the same as those of the second embodiment shown by the flowchart of FIG. 12. Only the execution of the step S102 of the fourth embodiment is different from that of the second embodiment. That is, in the procedure of the residual energy estimating method of the third embodiment, at the step S102, the correction factors $\alpha$, $\beta$ and $\gamma$ are calculated. More particularly, the temperature correction factor $\alpha$ is calculated by the temperature correction factor calculating section 12 on the basis of the temperature T. The internal resistance deterioration correction factor $\gamma$ is calculated from the average of the internal resistance calculation values of the initial battery and that of the deteriorated battery by using the equations (20). The capacity deterioration correction factor $\beta$ is obtained from the equations (22) and (23) explained in this embodiment.

(FIFTH EMBODIMENT)

A fifth embodiment of the method and apparatus of correcting a battery characteristic and of estimating a residual energy of a battery for an electric vehicle in accordance with the present invention. The fifth embodiment is also the same as the first embodiment except for the calculation method of the correction factors $\beta$ and $\gamma$. Since the correction method of the battery characteristic and the construction of the residual energy calculating apparatus in the fifth embodiment are the same as those of the first embodiment, the explanation of the same parts thereof will be omitted herein.

The calculation method of the correction factors $\beta$ and $\gamma$ of the fifth embodiment will be discussed.

The calculation method of the correction factor $\gamma$ of the fifth embodiment is the same as that of the fourth embodiment. That is, the internal resistance deterioration correction factor $\gamma$ of the fifth embodiment is obtained by calculating the average of the plural calculation results as represented by the following equations (20) of the fourth embodiment.

$$R0=(R01+R02++R0m)/m$$

$$Rd=(Rd1+Rd2++Rdn)/n$$

$$\gamma=R0/Rd \quad (20)$$

On the other hand, the capacity deterioration correction factor $\beta$ of the fifth embodiment is obtained by the calculation method shown in the second embodiment. That is, the correction factor $\beta n$ is calculated during the discharge late period such as a period where the DOD ranges from 50% to 100%. For example, factors $\beta 1$ to $\beta n$ are calculated at proper timings within the range of DOD 50% to 100%. Then, the average $\beta$ thereof is obtained by the following equation (13).

$$\beta=(\beta 1+\beta 2+\ldots+\beta n)/n \quad (13)$$

Otherwise, the capacity deterioration correction factor $\beta$ is obtained by averaging a newest calculated value and a value before the newest value as follows.

$$\beta=(\beta n-1+\beta n)/2 \quad (15)$$

Therefore, the procedure of the residual energy estimating method of the fifth embodiment are basically the same as those of the second embodiment shown by the flowchart of FIG. 12. Only the execution of the step S102 of the fourth embodiment is different from that of the second embodiment. That is, in the procedure of the residual energy estimating method of the third embodiment, at the step S102, the correction factors $\alpha$, $\beta$ and $\gamma$ are calculated. More particularly, the temperature correction factor $\alpha$ is calculated by the temperature correction factor calculating section 12 on the basis of the temperature T. The internal resistance deterioration correction factor $\gamma$ is calculated from the average of the internal resistance calculation values of the initial battery and that of the deteriorated battery by using the equations (20). The capacity deterioration correction factor $\beta$ is calculated by averaging the obtained correction factors $\beta n$ as mentioned above, upon employing the above-mentioned equation (13) or (15).

The contents of Applications No. 9-28797 with a filing date Feb. 13, 1997 and No. 9-298959 with a filing date Oct. 30, 1997 in Japan, are hereby incorporated by reference.

What is claimed is:

1. A method for correcting battery characteristic comprising the steps of:

detecting a temperature of a battery;

calculating a temperature correction factor on the basis of the detected battery temperature;

detecting a discharge characteristic of the battery;

calculating a deterioration correction factor on the basis of the detected battery discharge characteristic, the deterioration correction factor being constituted by an internal resistance deterioration correction factor relating to the change of an internal resistance of the battery and a capacity deterioration correction factor relating to the change of a battery capacity; and correcting a battery characteristic on the basis of the calculated battery temperature correction factor and the calculated deterioration correction factor.

2. A method as claimed in claim 1, wherein the internal resistance deterioration correction factor is calculated on the basis of a full charged power calculated from a discharge current and a terminal voltage of the battery in a full charged condition and a temperature-corrected power calculated from a temperature and the battery characteristic.

3. The method as claimed in claim 1, wherein a correlation between the internal resistance deterioration correction factor and the capacity deterioration correction factor is calculated on the basis of the change of the capacity of the battery and the deterioration of the output of the battery.

4. The method as claimed in claim 1, wherein the correction of the battery characteristic is executed on the basis of a calculated internal resistance change correction factor and a previously calculated internal resistance change correction factor.

5. The method as claimed in claim 4, wherein the battery characteristic is corrected by using the calculated internal resistance change correction factor and an average of plural-times calculated values of the internal resistance change correction factor previously calculated.

6. A battery characteristic correcting method used in estimating a residual energy of a battery on the basis of a battery characteristic corrected by the battery characteristic correcting method, a discharge current and a terminal voltage of the battery during discharging, said battery characteristic correcting method comprising the steps of:

detecting a temperature of the battery;

calculating a temperature correction factor on the basis of the detected battery temperature;

detecting a discharge characteristic of the battery;

calculating a deterioration correction factor on the basis of the detection battery discharge characteristic; and correcting a battery characteristic on the basis of the calculated battery temperature correction factor and the calculated deterioration correction factor, wherein the deterioration correction factor is constituted by an internal resistance deterioration correction factor relating to the change of an internal resistance of the battery and a capacity deterioration correction factor relating to the change of a battery capacity.

7. A method of estimating a residual energy of a battery comprising the steps of:

calculating a dischargeable amount and a discharge power amount of the battery from a corrected battery characteristic obtained by a battery characteristic correcting method; and calculating the residual energy of the battery from the calculated dischargeable amount and the discharged power amount of the battery, wherein the battery characteristic correcting method comprises the steps of detecting a temperature of a battery, calculating a temperature correction factor on the basis of the detected battery temperature, detecting a discharge characteristic of the battery, calculating a deterioration correction factor on the basis of the detected battery discharge characteristic, and correcting a battery characteristic on the basis of the calculated battery temperature correction factor and the calculated deterioration correction factor, wherein the deterioration correction factor is constituted by an internal resistance deterioration correction factor relating to the change of an internal resistance of the battery and a capacity deterioration correction factor relating to the change of a battery capacity.

8. A method of estimating a residual energy of a battery comprising the steps of:

estimating the residual energy of the battery using the following equation:

(residual energy)=(battery dischargeable amount)−(battery discharged power amount), wherein the battery dischargeable amount is a power amount which the battery discharges from a full capacity condition to a minimum power condition, and in the minimum power condition the battery can discharge a power for traveling an electric vehicle in a specified travel mode.

9. The method of estimating a residual energy of a battery comprising the steps of:

estimating the residual energy of the battery using the following equation:

(residual energy)=(battery dischargeable amount)−(battery discharged power amount), wherein the dischargeable amount is set at a value smaller than a power amount which the battery discharges from a full capacity condition to a minimum power condition, and in the minimum power condition the battery can discharge a power for traveling an electric vehicle in a specified travel mode.

10. An apparatus of correcting battery characteristic comprising:

a temperature detecting section detecting a temperature of a battery;

a temperature correction factor calculating section calculating a temperature correction factor on the basis of the detected battery temperature;

a deterioration detecting section detecting a discharge characteristic of the battery, the deterioration correcting factor being constituted by an internal resistance deterioration correction factor relating to the change of an internal resistance of the battery and a capacity deterioration correction factor relating to the change of a battery capacity;

a deterioration correction factor calculating section calculating a deterioration correction factor on the basis of the detected battery discharge characteristic; and a battery characteristic correcting section correcting the battery characteristic on the basis of the calculated battery temperature correction factor and the calculated deterioration correction factor.

11. The apparatus as claimed in claim 10, wherein the internal resistance deterioration correction factor is calculated on the basis of a full charged power calculated from a discharge current and a terminal voltage of the battery in a full charged condition and a temperature corrected power calculated from a temperature and the battery characteristic.

12. The apparatus as claimed in claim 10, wherein a correlation between the internal resistance deterioration correction factor and the capacity deterioration correction factor is calculated on the basis of the change of the capacity of the battery and the deterioration of the output of the battery.

13. The apparatus as claimed in claim 10, wherein the correction of the battery characteristic is executed on the basis of a calculated internal resistance change correction factor and a previously calculated internal resistance change correction factor.

14. An apparatus as claimed in claim 13, wherein the battery characteristic is corrected by using the calculated internal resistance change correction factor and an average of plural-times calculated values of the internal resistance change correction factor previously calculated.

15. A battery characteristic correcting apparatus used in estimating a residual energy of a battery on the basis of a battery characteristic corrected by the battery characteristic correcting apparatus, a discharge current and a terminal voltage of the battery during discharging, the battery characteristic correcting apparatus comprising:

a temperature detecting section detecting a temperature of the battery;

a temperature correction factor calculating section calculating a temperature correction factor on the basis of the detected battery temperature;

a deterioration detecting section detecting a discharge characteristic of the battery;

a deterioration correction factor calculating section calculating a deterioration correction factor on the basis of the detected battery discharge characteristic; and a battery characteristic correcting section correcting the battery characteristic on the basis of the calculated battery temperature correction factor and the calculated deterioration correction factor, wherein the deterioration correction factor is constituted by an internal resistance deterioration correction factor relating to the change of an internal resistance of the battery and a capacity deterioration correction factor relating to the change of a battery capacity.

16. An apparatus of estimating a residual energy of a battery comprising:

a battery characteristic calculating section calculating a dischargeable amount and a discharged power amount of the battery from the corrected battery characteristic obtained by a battery characteristic correcting apparatus;

a residual energy calculating section calculating the residual energy of the battery from the calculated dischargeable amount and the discharged power amount of the battery; and a display section displaying the residual energy calculated by said residual energy calculating section, wherein the battery characteristic correcting apparatus comprises a temperature detecting section detecting a temperature of the battery, a temperature correction factor calculating section calculating a temperature correction factor on the basis of the detected battery temperature, a deterioration detecting section detecting a discharge characteristic of the battery, a deterioration correction factor calculating section calculating a deterioration correction factor on the basis of the detected battery discharge characteristic, and a battery characteristic correcting section correcting the battery characteristic on the basis of the calculated battery temperature correction factor and the calculated deterioration correction factor, and the deterioration correction factor is constituted by an internal resistance deterioration correction factor relating to the change of an internal resistance of the battery and a capacity deterioration correction factor relating to the change of a batter capacity.

17. An apparatus of estimating a residual energy of a battery of an electric vehicle comprising:

a residual energy estimating section estimating a residual energy of the battery using the following equation:

(residual energy)=(battery dischargeable amount)−(battery discharged power amount), wherein the dischargeable amount is a power amount which is discharged by the battery from a full capacity condition to a minimum power condition, and in the minimum power condition the battery can discharge a power for traveling an electric vehicle in a specified travel mode; and a displaying section displaying the residual energy estimated by said residual energy estimating section.

18. An apparatus of estimating a residual energy of a battery comprising:

a residual energy estimating section estimating a residual energy of the battery using the following equation:

(residual energy)=(battery dischargeable amount)−(battery discharged power amount), wherein the dischargeable amount is set at a value smaller than a power amount which the battery discharges from a full capacity condition to a minimum power condition, and in the minimum power condition the battery can discharge a power for traveling an electric vehicle in a specified travel mode; and a display section displaying the residual energy estimated by said residual energy estimating section.

19. A method for correcting a battery characteristic comprising the steps of:

calculating a temperature correction factor representative of a degree of a temperature dependency of the battery characteristic;

calculating an internal resistance deterioration correction factor representative of a ratio between an internal resistance of a new battery and that of a deteriorated battery;

calculating a capacity deterioration correction factor representative of a ratio between a dischargeable power amount of the new battery and that of the deteriorated battery; and correcting the battery characteristic on the basis of the temperature correction factor, the internal resistance deterioration correction factor and the capacity deterioration correction factor.

20. The method as claimed in claim 19, wherein the internal resistance deterioration correction factor is calculated on the basis of the internal resistance calculated from a battery discharge I–V characteristic obtained from a current value and a voltage value of the battery during discharge, and the capacity deterioration correction factor is calculated on the basis of the battery dischargeable capacity calculated from a relationship between a battery discharged power amount and an estimated open-circuit voltage obtained from the battery discharge I–V characteristic.

21. The method as claimed in claim 19, wherein the internal resistance deterioration correction factor is calculated on the basis of a full charged power calculated from a discharge current and a terminal voltage of the battery in a full charged condition and a temperature corrected power calculated from a temperature and the battery characteristic.

22. The method as claimed in claim 19, wherein the capacity deterioration correction factor is calculated from the internal resistance deterioration correction factor and a correlation between the internal resistance deterioration correction factor and the capacity deterioration correction factor which correlation is obtained from practically measured values of the change of the capacity of the battery and the deterioration of the output of the battery.

23. The method as claimed in claim 19, wherein the internal resistance deterioration correction factor is calculated by averaging calculation values of the internal resistance deterioration correction factor calculated at predetermined intervals.

24. The method as claimed in claim 19, wherein the capacity deterioration correction factor is calculating by averaging calculation values of the capacity change correction factor calculated at predetermined intervals.

25. The method as claimed in claim 19, wherein the internal resistance deterioration correction factor is calculated by averaging last two calculation values of the internal resistance deterioration correction factor calculated at predetermined intervals.

26. The method as claimed in claim 19, wherein the capacity deterioration correction factor is calculating by averaging last two calculation values of capacity change correction factor calculated at predetermined intervals.

27. The method as claimed in claim 19, wherein the internal resistance deterioration correction factor is calculated from a ratio between an initial internal resistance obtained from an initial battery discharge characteristic and a present internal resistance obtained from a present battery discharge characteristic.

28. The method as claimed in claim 19, wherein the capacity deterioration correction factor is calculated from a ratio between an new-battery capacity obtained from a new-battery discharge characteristic and a present internal resistance obtained from a present-battery discharge characteristic.

29. The method as claimed in claim 19, wherein the internal resistance deterioration correction factor is calculated by comparing a new-battery discharge I–V characteristic and an actual discharge I–V characteristic.

30. The method as claimed in claim 19, wherein the capacity deterioration correction factor $\beta$ is obtained from the following equations:

$E = Vf - C \cdot K$ $C0 = (Vf - Ve)/K0$ $Cd = (Vf' - Ve)/Kd$ $\beta = Cd/C0$ wherein E is an open-circuit voltage, K is a gradient of the characteristic line of each battery, Vf and Vf' are voltage intercepts of the characteristic line of a new battery and of a deteriorated battery, Ve is a predetermined discharge capacity reference voltage, and C0 and Cd are battery capacities of the new battery and the deteriorated battery.

31. The method of estimating a residual energy of a battery comprising the steps of:

calculating a dischargeable amount of the battery from a corrected battery characteristic obtained by a battery characteristic correcting method; and calculating the residual energy of the battery from the dischargeable amount and a discharge power integrating amount of the battery, wherein the battery characteristic correcting method comprises the steps of calculating a temperature correction factor representative of a degree of a temperature dependency of the battery characteristic, calculating an internal resistance deterioration correction factor representative of a ratio between an internal resistance of a new battery and that of a deteriorated battery, calculating a capacity deterioration correction factor representative of a ratio between a dischargeable power amount of the new battery and that of the deteriorated battery, and correcting the battery characteristic on the basis of the temperature correction factor, the internal resistance deterioration correction factor and the capacity deterioration correction factor.

* * * * *